(12) United States Patent
Teyssedre et al.

(10) Patent No.: US 12,233,577 B2
(45) Date of Patent: Feb. 25, 2025

(54) METHOD FOR MANUFACTURING A MOULD FOR NANOPRINTING AND ASSOCIATED MOULD

(71) Applicant: COMMISSARIAT A L'ENERGIE ATOMIQUE ET AUX ENERGIES ALTERNATIVES, Paris (FR)

(72) Inventors: Hubert Teyssedre, Grenoble (FR); Nicolas Posseme, Grenoble (FR); Stefan Landis, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 18/693,438

(22) PCT Filed: Sep. 22, 2022

(86) PCT No.: PCT/EP2022/076451
§ 371 (c)(1),
(2) Date: Mar. 19, 2024

(87) PCT Pub. No.: WO2023/046870
PCT Pub. Date: Mar. 30, 2023

(65) Prior Publication Data
US 2024/0326297 A1    Oct. 3, 2024

(30) Foreign Application Priority Data
Sep. 24, 2021  (FR) ...................................... 21 10075

(51) Int. Cl.
B29C 33/38    (2006.01)
B29C 59/02    (2006.01)

(52) U.S. Cl.
CPC .......... *B29C 33/3842* (2013.01); *B29C 59/02* (2013.01)

(58) Field of Classification Search
None
See application file for complete search history.

(56) References Cited

U.S. PATENT DOCUMENTS

| | | |
|---|---|---|
| 2016/0308020 A1 | 10/2016 | Sreenivasan et al. |
| 2017/0345655 A1 | 11/2017 | Posseme et al. |
| 2017/0363954 A1* | 12/2017 | Landis ................... C23C 14/48 |
| 2018/0001582 A1 | 1/2018 | Posseme et al. |
| 2019/0369310 A1 | 12/2019 | Melli et al. |
| 2023/0266594 A1* | 8/2023 | Peroz ................... G03F 7/0002 385/37 |

FOREIGN PATENT DOCUMENTS

EP    0 731 387 A2    9/1996

* cited by examiner

*Primary Examiner* — Roberts P Culbert
(74) *Attorney, Agent, or Firm* — Oblon, McClelland, Maier & Neustadt, L.L.P.

(57) ABSTRACT

A method for manufacturing a mould for nanoprinting and the associated mould, includes providing a substrate having a layer, and at least one ion implantation configured so as to obtain in the layer, at least one first non-implanted portion or portion having a first implantation, at least one second portion having a second implantation, and a third non-implanted portion distinct from the first portion. After implantation, the method includes etching the layer configured so as to have a different etching speed between at least the second portion and the third portion, so as to etch through the openings of an etching mask, a plurality of patterns of different heights being included in the layer.

18 Claims, 10 Drawing Sheets

METHOD FOR MANUFACTURING A MOULD FOR NANOPRINTING AND ASSOCIATED MOULD

TECHNICAL FIELD OF THE INVENTION

The present invention relates to the field of nanometric printing lithography, also called nanoprinting. It has a particularly advantageous application in manufacturing master moulds serving to produce moulds for producing patterns having a high resolution, i.e. patterns, the critical dimensions of which are a few hundred nanometres ($10^{-9}$ metres), even a few tens of nanometres.

PRIOR ART

Nanometric printing lithography techniques are based on printing with a mould of a deformable resin, deposited on a substrate. The mould comprises patterns which are transferred into the resin during printing. These patterns are commonly measured in tens of nanometres. The resin film structured by nanoprinting can serve as an etching mask for the following steps of manufacturing a microelectronic, optical or micromechanical device, for example.

Standard nanometric printing standards can be differentiated, in particular, according to three criteria:

Direct or Indirect Replication

For a direct replication, the mould is directly put into contact with the resin film to be structured. A reversed polarity is thus had between the mould and the structured resin.

For an indirect replication, patterns of a so-called master mould are copied into a secondary mould, which will itself be printed in the resin to be structured. The secondary mould can be used once or several times according to the technologies. This method has become the reference of industrial solutions, as it limits the risk of damaging, even breaking the master mould.

Thermal or UV Method

Choosing a method implementing a step of solidifying the resin by a thermal or UV means, depends on the nature of the resin to be structured. Thermal methods are generally used for shaping non-liquid thermoplastic resins at ambient temperature, or for cross-linking thermosetting resins. UV methods are generally used to cross-link photosensitive resins. The combination of these two types of methods is possible for hybrid resins being able to demand a photo- and a thermo-activation.

Rigidity of the Moulds and of the Substrate

The moulds and/or the substrate can be rigid, i.e. be slightly deformable under the action of their own weight for thicknesses of a few hundred micrometres and have a Young's modulus greater than 10 GPa (for example, by being silicon- or aluminium-based).

The moulds, in particular, can be flexible, i.e. macroscopically deformable under the action of their own weight for thicknesses going up to a few hundred micrometres and to have a Young's modulus less than 10 GPa (for example, by being polyethylene terephthalate PET-, polycarbonate PC-based, etc.).

Whatever the technique used, nanoprinting involves movements and/or resin flow during the pattern transfer, such that the free spaces between the patterns of the mould are filled with the resin. In practice, a person skilled in the art choose the quantity of initial resin so as to leave a residual thickness 30 under the patterns 31a, 31b, such as illustrated, for example, in FIG. 1A.

This filling with the resin implies that the quantity of resin necessary depends on the pattern density if the height of the latter is constant. Due to this, if the pattern density varies according to the locations on a mould, then the resin volumes to fill them and obtain a homogenous residual thickness will be different, or, with an equivalent initial resin volume, the residual resin thickness will not be homogenous in the printed resin layer, as illustrated under the patterns 31a and 31b in FIG. 1A. It is, in particular, the case for technologies which use spin-coating, for resin spreading, following which the resin thickness is substantially constant at any point of the surface of the substrate before printing.

The variation of the residual thickness induces limitations for the etching of the patterns 31a, 3b in the substrate 3. Indeed, this etching generally comprises a preliminary step of removing the residual resin thickness 30 by an anisotropic method. The complete removal of this residual thickness 30 generally occurs first in the least dense patterns 31a, as illustrated by FIG. 1B, then in the densest patterns 31b, as illustrated by FIG. 1C. This leads to a risk of loss of the critical dimensions of the patterns with respect to the patterns of the mould, and a significant decrease of the resin quantity being able to then be consumed during the etching of the pattern.

To avoid this, solutions consist of adapting the height of the patterns on the mould according to the pattern density, to obtain a substantially homogenous residual resin thickness.

For this, a first solution consists of separating the patterns to be produced in sets of patterns, each set having patterns with a given average density, the sets together having different pattern densities. One mould per set is thus produced and the steps of copying the master and depositing the resin are successively performed per set of patterns, so as to have a homogeneous residual thickness between the different sets.

A second solution consists of manufacturing a master having different pattern heights corresponding to the different densities. On the master to be manufactured, the patterns to be produced in sets of patterns are separated, each set having patterns with a given average density, the sets together having different pattern densities. The different sets of patterns of the mould are manufactured by application of a mask then lithography successively for each set, such that each set has the suitable pattern height.

Whatever the solution above, these solutions demand numerous steps and are complex to implement. In particular, these solutions have high constraints in terms of alignment of the different sets of patterns during successive manufacturing steps. For the alignment of these sets, current equipment generally makes it possible for a lateral resolution of between 2 and 10 μm. A resolution less than 100 nm, and preferably around 10 nm would be to have, to enable a reliable and reproducible alignment.

There is therefore a need consisting of proposing a solution to improve the manufacture of a mould for nanoprinting, making it possible to control the residual resin thickness.

Other aims, features and advantages of the present invention will appear upon examining the description below and the accompanying drawings. It is understood that other advantages can be incorporated.

SUMMARY OF THE INVENTION

To achieve this aim, according to an embodiment, a method for manufacturing a mould for nanoprinting is provided, comprising a provision of a substrate comprising a layer having an upper face and a lower face opposite the upper face.

The method further comprises at least one ion implantation in at least one portion of the layer, the ion implantation being configured so as to obtain, within the layer, at least one first non-implanted portion, or portion having a first implantation, and at least one second portion having a second implantation, the first implantation and the second implantation being different, the first and second portions each extending from said upper face, the ion implantation further defining a third non-implanted portion, extending at least from the first portion, and preferably from the first and second portions, up to the lower face of the layer.

After or before implantation, the method comprises the production of a so-called etching mask surmounting the upper face and having a plurality of openings.

After implantation, the method comprises an etching of the layer configured so as to have a different etching speed, at least between the second portion and the third portion, preferably between the first and second portions and the third portion, so as to etch through the openings of the etching mask, a plurality of patterns of different heights in the layer, at least one pattern extending into the first portion and at least one pattern extending into the second portion.

The ion implantation makes it possible to modify the etching properties of the second portion, if necessary of the first portion, by the ion implantation in the layer. Thus, during the etching of the patterns in each of these portions, the etching speed differing between the implanted non-implanted portions, optionally between implanted portions of a different nature, patterns of different heights are obtained for one same etching step, for example, for one same etching time. It is subsequently no longer necessary to successively produce the patterns for each pattern height. The alignment constraints are subsequently minimised, and preferably avoided.

The mould manufacturing method is consequently simplified. The manufacturing cost of the mould is reduced. Furthermore, the manufacturing method is made reliable, since the constraints linked to the alignment between different patterns of different heights are relaxed.

According to an example, the first implantation and the second implantation differ by at least one parameter from among: an implantation depth, a nature of the implanted ions, a dose of implanted ions. Thus, the first and second portions differ by one of these parameters, modifying the etching speed between these portions.

Another aspect relates to a mould by nanoprinting, comprising a substrate comprising a layer having an upper face and a lower face opposite the upper face and a plurality of patterns extending from the upper face, the layer being intended to penetrate into a layer to be printed to transfer the patterns there, at least one pattern having a height different from another pattern.

Advantageously, the layer comprises at least one first non-implanted portion or portion having a first implantation, and at least one second portion having a second implantation, the first implantation and the second implantation being different, the first and second portions each extending from said upper face; and a third non-implanted portion extending at least from the first portion, and preferably from the first and second portions, up to the lower face of the layer.

The mould thus has the advantages of the manufacturing method according to the first aspect. In particular, the patterns of different height carried by the layer are made reliable with respect to the patterns that are sought to be obtained by nanoprinting. The alignments between the patterns of different heights are indeed facilitated, thanks to the manufacturing method. In the end, with respect to known solutions, the proposed mould makes it possible to reduce alignment inaccuracies and improves the overall accuracy of the printing performed. The mould therefore makes it possible to simplify the nanoprinting, by avoiding multiple steps of printing on the substrate to be printed, and to make the nanoprinting reliable with respect to the current solutions implementing a mould having patterns of different heights. Furthermore, the cost of the mould is reduced with respect to these solutions.

According to an example, the mould is a so-called master mould, intended to serve the production of secondary moulds.

BRIEF DESCRIPTION OF THE FIGURES

The aims, objectives, as well as the features and advantages of the invention will best emerge from the detailed description of an embodiment of the latter, which is illustrated by the following accompanying drawings, wherein.

Figure 1A:
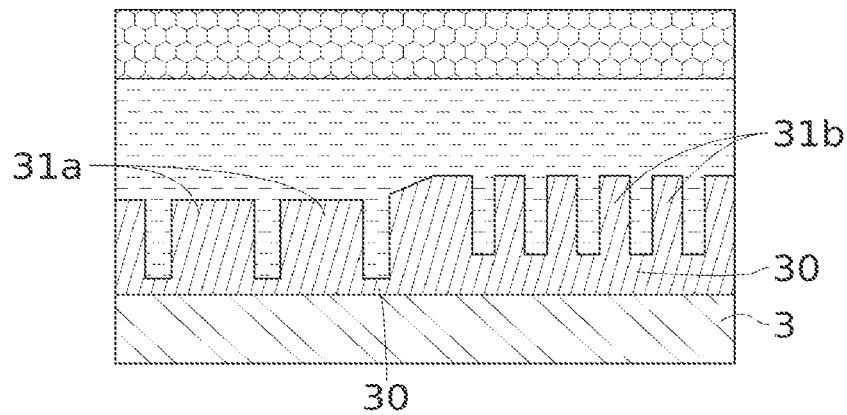
FIGS. 1A to 1C represent steps of transferring patterns and etching to remove the residual resin thickness after transfer, according to a solution of the current prior art.
Figure 1B:
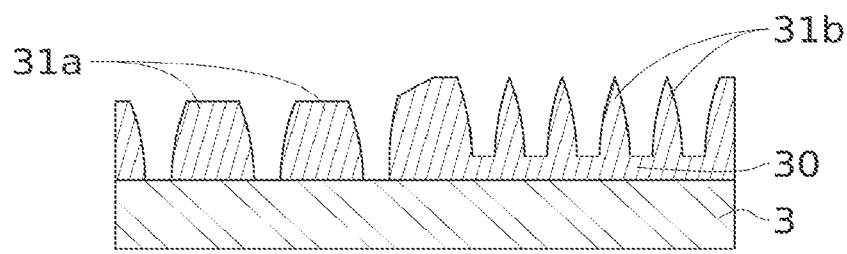
Figure 1C:
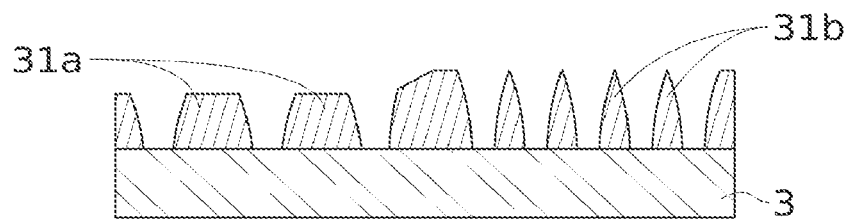

The drawings are given as examples, and are not limiting of the invention. They constitute principle schematic representations intended to facilitate the understanding of the invention and are not necessarily to the scale of practical applications. In particular, the relative dimensions of the masks, layers, layer portions and patterns and openings are not representative of reality.

DETAILED DESCRIPTION OF THE INVENTION

Before starting a detailed review of embodiments of the invention, below optional features are stated, which can optionally be used in association or alternatively.

According to an example, the etching is configured to etch, in the first portion, a first set of patterns and to etch, in the second portion, a second set of patterns:
the first set of patterns having a first pattern density $D_1$ and a first height $H_1$,
the second set of patterns having a second pattern density $D_2$, and a second height $H_2$, and $D_2 > D_1$ and/or $H_2 > H_1$.

Thus, for a lower pattern density, the height $H_1$ is lower than the height of the patterns for a greater pattern density. The adaptation of the height according to the pattern density makes it possible to further improve the homogeneity of the residual resin layer during nanoprinting.

The heights of the etched patterns are measured from the upper face of the layer, and up to a bottom of the patterns. This measurement is preferably taken in a direction perpendicular to a plane, wherein the upper face main extends. Preferably, this direction is parallel to the favoured implantation direction.

According to an example, the etching is configured such that the etching speed at least of the second portion, preferably of the first and second portions, is greater than the etching speed of the third non-implanted portion. Thus, the non-implanted portion forms a braking layer, even a stop layer, of the etching, making it possible to control the height of the etched pattern from the implanted portions.

According to an example, prior to the ion implantation, and preferably before the production of the etching mask, the method comprises the production of a so-called implantation mask on at least one portion of the upper face of the layer, and the ion implantation is at least partially performed through the implantation mask, such that the first implanted portion has a first implantation depth $P_1$ and the second implanted portion has a second implantation depth $P_2$, with $P_2$ strictly greater than $P_1$ and $P_1$, zero or greater than 0.

The implantation mask makes it possible to create a difference of height on the surface of the layer. During the ion implantation, the penetration of the ions into the layer will be impacted by the presence or not of a mask, and the optional variation of thickness of the implantation mask above the layer. According to the implanted location, the ions will therefore progress up to different depths. The depth gradient makes it possible to modulate the etching speeds of the patterns along the normal to the main extension plane of the upper face. For a low implantation depth, the etched patterns have, for example, a lesser height. For a greater implantation depth, the etched patterns have, for example, a greater height.

The implanted depth is measured from the upper face of the layer and in a direction perpendicular to a plane, wherein the upper face mainly extends. Preferably, this direction is parallel to the favoured implantation direction.

According to an example, the mould is called flexible, i.e. that it is deformable under the action of their own weight and/or a pressing force in a resin layer. Typically, for thicknesses going up to a few hundred micrometres and to have a Young's modulus, for example, less than 10 GPa.

According to an example, the implantation mask is configured to only cover a portion of the upper face of the layer.

According to an example, $P_2$ is strictly greater than $P_1$, and $P_1$ is non-zero. Thus, the entire upper face is implanted, at different depths.

According to an example, $P_2$ is strictly greater than $P_1$, and $P_1$ is zero. Thus, a fraction of the upper face is not implanted.

According to an example, the implantation mask is configured, so as to have a thickness gradient between at least one first thickness $E_1$ and one second thickness $E_2$, with $E_1$ strictly greater than $E_2$ and $E_2$ zero or greater than 0.

Preferably, $E_2$ is strictly greater than 0. Thus, the layer is covered by the mask on the surface of its first portion and of its second portion. This improves the quality of the interface between the implantation mask and the substrate after the ion implantation. Indeed, if $E_2$ is zero, then the surface of the layer is not protected during the ion implantation, at the surface of the second portion. According to the implantation conditions, it is possible that the properties of the second portion, not protected, are different from those of the first portion protected by the implantation mask. Consequently, different etching behaviours can be had. It is therefore advantageous that the first and second portions are covered by the implantation mask of non-zero thickness, to obtain a surface of homogenous property coming from the implantation.

According to an example, the thickness gradient of the mask between $E_1$ and $E_2$ is substantially equal to the depth difference between $P_1$ and $P_2$.

According to an example, the first thickness $E_1$ is substantially between 50 nm and 100 μm. According to an example, the second thickness $E_2$ is substantially between 0 nm and $E_1$.

According to an example, the method comprises a removal of the mask after implantation and before the etching step.

According to an example, the ion implantation is configured such that at least the second implantation depth $P_2$, and preferably the first $P_1$ and second $P_2$ depths, is/are greater than or equal to 30 nm, preferably strictly greater than 30 nm. According to an example, the ion implantation is configured, such that at least one, and preferably each, from among the first and second implantation depths is less than or equal to 1 μm ($10^{-6}$ metres). Preferably, the ion implantation is configured such that at least one, and preferably each, from among the first and second implantation depths is between 30 nm and 1 μm.

The ion implantation can thus be done over a depth substantially equal to the height of the pattern, which will be obtained by etching. This is particularly advantageous to implement a selective etching of the implanted portion with respect to the non-implanted portion. The non-implanted portion under the implanted portion can thus serve as a stop layer during etching.

According to an example, the ion implantation is done by an implanter.

According to an example, the ion implantation is configured, such that the first $P_1$ and second $P_2$ implantation depths are less than or equal to 30 nm, preferably less than or equal to 10 nm. The ion implantation can thus be done on the surface of the layer. The implanted portions can serve as a braking, or preferably acceleration primer to the etching to manufacture the patterns.

According to an example, the ion implantation is done by a plasma.

According to an example, the implantation mask is configured, such that the first and second portions are spaced apart, in a direction parallel to a main extension plane of the upper face of the layer, of a distance less than or equal to the smallest distance separating two adjacent patterns of different heights. Thus, in a direction parallel to the main extension plane of the upper face, the distance over which the resin thickness varies during the pattern transfer by the mould, is less than or equal to the distance between the patterns of different heights. The resin thickness only varies between two zones where the resin thickness is constant.

According to an example, the thickness gradient of the implantation mask is configured, such that the first and second portions are spaced apart, in a direction parallel to the main extension plane of the upper face of the layer, of a distance less than or equal to the smallest distance separating two adjacent patterns of different heights.

According to an example, the implantation mask is configured such that the first and second portions are separated by an intermediate portion, wherein the implantation depth varies. The intermediate portion thus has a progressive depth gradient between the first and second portions.

According to an example, the thickness gradient of the implantation mask is configured, such that the first and second portions are separated by an intermediate portion, wherein the implantation depth varies.

According to an example, the implantation mask is configured, such that the first and second portions are directly adjacent. The first and second portions thus form a steep depth gradient between $P_1$ and $P_2$.

According to an example, the thickness gradient of the implantation mask is configured, such that the first and second portions are directly adjacent.

According to an example, the ion implantation is configured, such that the first and second portions taken together extend over substantially the entire main extension plane of the upper face of the layer.

According to an example, prior to the etching, the method comprises several ion implantations, so as to implant a plurality of first portions and a plurality of second portions, the ion implantations being configured together, such that:
  the first portions differ from the second portions by at least one of the parameters taken from among: a nature of the implanted ions, a dose of implanted ions, and/or
  the first and second portions have implantation depths $P_1$, $P_2$ different between the first portions and the second portions.

Thus, the method makes it possible to implant first portions and second portions in the layer, preferably localised. According to the nature of the ion and/or the implantation depth, the etching speed is modulated to obtain patterns of different heights in each of the portions.

According to an example, each implanted portion has one single implantation depth.

According to an example, the implanted portions are separated from one another by the third non-implanted portion.

According to an example, at least one pattern extends into each of the implanted portions.

According to an example, at least one from among the first portion and the second portion, preferably the first portion and the second portion, is/are implanted with an implantation dose substantially between $10^{12}$ and $10^{15}$ at/$cm^2$.

According to an example, the ion implantations are configured, such that each of the first and second implanted portions extends, in a direction parallel to the main extension direction of the upper face of the layer, over a distance substantially equal to a dimension of the pattern made during etching, in the same direction.

According to an example, the ion implantations are performed through the etching mask, such that each of the first and second implanted portions extends in line with the openings of the etching mask.

In this direction, the dimensions of an implanted portion coincide with those of the pattern to be etched. The implanted portion thus makes it possible to modulate the properties of the layer to define the contours of the pattern to be etched.

According to an example, the etching is configured to selectively etch each implanted portion, at least the second portion, and if necessary, the first and second portions, with respect to the third non-implanted portion. Thus, during etching, the non-implanted portion forms a stop layer of the etching. The etching step is made more reliable and reproducible, by depending less and preferably by no longer depending on the etching time.

According to an example, the etching is configured such that the etching speed of the implanted portion is at least 100 times greater than the etching speed of the non-implanted portion.

According to an example, the etching is configured so as to not etch the non-implanted portion.

According to an example, the etching is stopped after having consumed the entire thickness of the second portion located in line with the openings of the etching mask. The depth of the patterns is thus controlled with accuracy.

According to an example, the ion implantation is configured to implant at least one from among oxygen, hydrogen, helium, arsenic, phosphor and carbon ions, in the layer.

According to an example, the layer is with the basis or made of at least one from among silicon or a material transparent at a 365 nm wavelength.

According to an example, the method is such that $D2>D1$ and $H2>H1$.

According to an example, the method is such that $D2>D1$ and $H2<H1$.

According to an example, the layer is made of silicon.

According to an example, the layer is with the basis or made of silicon oxide of formula $SiO_2$, of silicon carbide of formula $SiC$.

According to an example, the method comprises one single etching step.

According to an example, the mould is a so-called master mould, intended to serve for the production of secondary moulds for nanoprinting.

According to an example, the mould is such that $D2>D1$ and $H2>H1$.

According to an example, the mould is such that $D2>D1$ and $H2<H1$.

According to an example, the mould is a master mould and the total volume $Vb$ of the hollow zones defined by the second set of patterns is greater than the total volume $Va$ of the hollow zones defined by the first set of patterns.

According to another example, the mould is a "direct" mould, intended to be pressed in a resin without intermediate mould. In this case, the volume $Vb$ of the hollow zones defined by the second set of patterns is less than the total volume $Va$ of the hollow zones defined by the first set of patterns.

According to an example, the implantation is performed in a favoured implantation direction perpendicular to the upper face.

According to an example, in the mould, the first implanted portion has a first implantation depth $P_1$ and the second implanted portion has a second implantation depth $P_2$, with $P_2$ strictly greater than $P_1$ and $P_1$ zero or greater than 0.

30)

According to an example, the layer has, in the first portion, a first set of patterns, and in the second portion, a second set of patterns, such that:
the first set of patterns having a first pattern density $D_1$ and a first height $H_1$,
the second set of patterns having a second pattern density $D_2$, and $D_2 > D_1$ and/or $H_2 > H_1$.

According to an example, at least one, and preferably each, from among the first and second implantation depths is greater than or equal to 30 nm.

According to an example, at least one, and preferably each, from among the first and second implantation depths is less than or equal to 1 µm.

Preferably, at least one, and preferably each, from among the first and second implantation depths is between 30 nm and 1 µm.

According to an example, the first and second implantation depths are less than or equal to 30 nm, preferably less than or equal to 10 nm.

According to an example, the first and second portions are spaced apart, in a direction parallel to the main extension plane of the upper face of the layer, by a distance less than or equal to the smallest distance separating two adjacent patterns of different heights.

It is specified that in the scope of the present invention, by a substrate or a layer "with the basis" of a species A, this means a substrate or a layer comprising this species A only, or this species A and optionally other species.

A substrate comprising a layer can be:
either, preferably, a stack wherein the substrate comprises the layer deposited on a support layer,
or a substrate only comprising the layer. In this case, the layer can be self-supporting, i.e. that it supports its own weight.

In the scope of the present invention, a material which makes it possible to transmit at least 70% of a light flow of this given wavelength is qualified as a transparent material with a given wavelength.

Several examples of embodiments of the invention implementing successive steps of the manufacturing method are described below. Unless explicitly mentioned otherwise, the adjective "successive" does not necessarily imply, even if this is generally preferred, that the steps follow one another immediately, intermediate steps being able to separate them.

Moreover, the term "step" means the embodiment of a part of the method, and can reference a set of substeps.

Moreover, the term "step" does not compulsorily mean that the actions carried out during a step are simultaneous or immediately successive. Certain actions of a first step can, in particular, be followed by actions linked to a different step, and other actions of the first step can then be resumed. Thus, the term "step" does not necessarily mean single and inseparable actions over time and in the sequence of the phases of the method.

By microelectronic device, this means any type of device produced with the microelectronic means. These devices comprise, in particular in addition to devices with a purely electronic purpose, micromechanical or electromechanical devices (MEMS, NEMS, etc.) as well as optical or optoelectronic devices (MOEMS, LED, etc.).

This can be a device intended to ensure an electronic, optical, mechanical function, etc. This can also be an intermediate product only intended for the production of another microelectronic device.

It is specified that in the scope of the present invention, the thickness of a layer or of the substrate is measured in a direction perpendicular to the surface, according to which this layer or this substrate has its maximum extension. The thickness is thus taken in a direction perpendicular to the main faces of the layer, or of the substrate on which the different layers rest. In the figures, the thickness is taken along the vertical.

It is specified that, in the scope of the present invention, the terms "on", "surmounts", "covers", "underlying", "opposite" and their equivalents do not necessarily mean "in contact with". Thus, for example, the deposition, the transfer, the assembly or the application of a first layer on a second layer, does not compulsorily mean that the two layers are directly in contact with one another, but means that the first layer covers at least partially the second layer, by being either directly in contact with it, or by being separated from it by at least one other layer or at least one other element.

By a parameter "substantially equal to/greater than/less than" a given value, this means that this parameter is equal to/greater than/less than the given value, plus or minus 10%, close to this value. By a parameter "substantially between" two given values, this means that this parameter is, as a minimum, equal to the smallest given value, plus or minus 10%, close to this value, and as a maximum, equal to the greatest given value, plus or minus 10%, close to this value.

In the scope of the present invention, an organic or organo-mineral material being able to be mechanically shaped by pressing by a mould comprising patterns is qualified as a printable resin. A cross-linking or polymerisable resin is a printable resin which has the faculty to cross-link or to polymerise by exposure to a photon beam, for example, in the ultraviolet range and/or by application of a temperature. This type of resin is conventionally used in UV-assisted or thermally-assisted nanometric printing methods.

In the scope of the invention, the energies are given in electronvolts, for which $1\ eV = 1.602 \cdot 10^{-19}$ J, in the international unit system.

Several non-limiting examples of the invention will now be described in detail, in reference to FIGS. 2A to 7B.

The method comprises the provision of a substrate 10 comprising a layer 11 having an upper face 110 and a lower face 115 opposite the upper face 110. In the figures, it is considered, in a non-limiting manner, that the substrate 10 is a stack comprising a support layer 10a, which can also be referenced support substrate, and the layer 11 surmounting the support layer 10a. It can be provided that the substrate 10 only comprises the layer 11.

The method further comprises an ion implantation, configured such that the layer 11 has at least one first portion 111 and at least one second portion 112, each of these portions extending from the upper face 110. The properties of these portions are different from one another, such that an etching of patterns 114a, 114b from each of these portions 111, 112 gives patterns 114a, 114b of different heights.

) For this, the ion implantation is configured such that the first portion 111 is not implanted or has a first implantation different from the second implantation. The second portion 112 is implanted, and has the second implantation. According to an example, the first implantation and the second implantation differ by, as subsequently described in more detail in reference to the figures:
an implantation depth, and/or
a nature of the implanted ions, and/or
a dose of implanted ions.

For this, the ion implantation parameters can be varied, and for example, the type of implanted ions, the implantation energy and/or the dose of implanted ions, in a known manner for a person skilled in the art. In practice, the ion implantation induced in the implanted material, a lateral extension of the implanted zone through the interactions (elastic and inelastic) between the ions and the implanted material, which is conveyed by the presence of a switch for diffusing the implanted ions, well-known to a person skilled in the art. The geometric shape of this switch, namely the implanted depth and the optional lateral extensions of the latter, depends in particular on:

the implantation conditions: atomic number of the implanted ion and of the acceleration voltage in the equipment;

the materials of the deposited layers and the substrate used, which will impact the intensities of the interactions between the ions and the implanted materials.

A skilled person can, for example, resort to known tools, such as SRIM (Stopping and Range of Ions in Matter) or TRIM (TRansport of Ions in Matter) which make it possible to simulate the interactions between ions and the material of the layer 11.

The ion implantation further defines, in the layer 11, a third non-implanted portion 11 extending at least from the first portion 111, and preferably from the first 111 and second 112 portions up to the lower face 115 of the layer 11. The third portion 113 extends more particularly in line with the first portion 111 only, or in line with of the first 111 and second 112 portions. According to an example, the second portion 112 extends up to the lower face 150 of the layer 11.

Before or after implantation, an etching mask 13 is made on the upper face 110. The etching mask 13 has a plurality of openings 130a, 130b from which the patterns of the mould 1 will be formed in the etching step.

After producing the etching mask 13 and after implantation, the method further comprises an etching of the layer 11 configured so as to have a different etching speed between at least the second portion 112 and the third portion 113. The etching can be a wet etching or preferably a dry etching, for example a plasma etching or a reactive ion etching (RIE).

According to an example, the etching of the layer 11 is configured so as to have a different etching speed between the assembly formed by the first 111 and second 112 portions, and the third portion 113. According to another example, the etching of the layer 11 is configured so as to have a different etching speed between each from among the first portion 111, the second portion 112 and the third portion 113.

The etching is configured to form at least one pattern 114a extending into the first portion 111 and at least one pattern 114b extending into the second portion 112, from the upper face 110. The patterns 114a, 114b can extend only into the first portion 111 and/or second portion 112. The patterns 114a, 114b can extend respectively into the first 111 and second portion 112, and into the third portion 113 extending between the first 111 and/or second portion 112 and the lower face 150 of the layer 11. The patterns are hollow shapes extending preferably in line with the upper face 110, from this face 110, etched through the openings 130a, 130b of the etching mask 13. The patterns are formed in line with the walls delimited by the openings 130b, 130b of the etching mask 13.

The different etching speeds make it possible to etch different patterns between the first 111 and second 112 portions, and more specifically, patterns of different heights in the layer 11, the height being taken from the upper face 110, or equivalently from the tops of the patterns 114a, 114b, to the bottom of the patterns, in a direction perpendicular to the main extension plane of the upper face 110. In the figures, the height of the patterns is taken along the vertical.

According to a preferred example, the etching speed of the second portion 112 is strictly greater than the etching speed of a non-implanted portion of the layer 11, and in particular, the third portion 113. A non-implanted portion thus forms a braking layer, even a stop layer, of the etching, making it possible to best control the height of the etched patterns 114a, 114b. According to an example, the etching speed of the assembly formed by the first 111 and second 112 portions is strictly greater than the etching speed of the third portion 113. According to another example, the etching speed of each from among the first portion 111 and the second portion 112 is strictly greater than the etching speed of the third non-implanted portion 13, the etching speeds between the first portion 111 and the second portion 112 being able to differ.

Figure 4C:
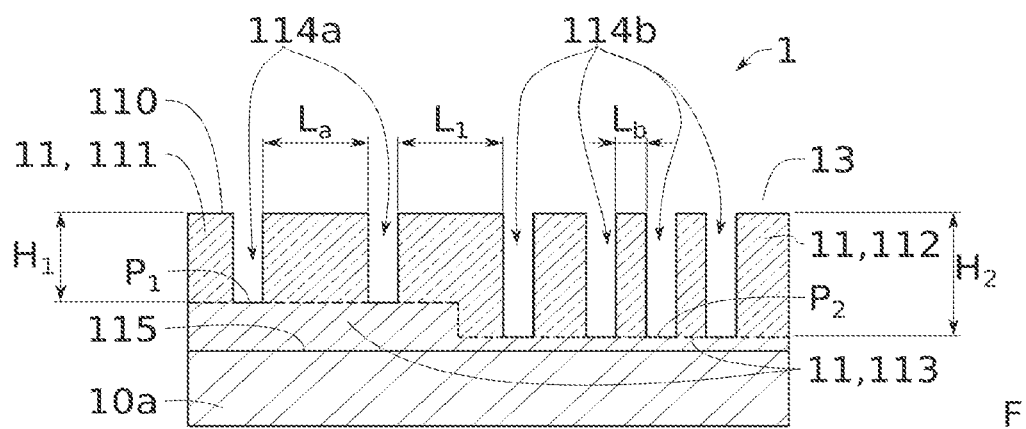

According to an example, it is sought to etch a first set of patterns 114a having a first density, and a second set of patterns 114b having a second density. In the scope of this invention, by the term "density", this means the surface or the volume occupied by the hollow shapes that the patterns 114a, 114b constitute in the layer 11, on a given surface taken along a cross-section of the patterns parallel to the upper face 110 or the lower face of the layer 11. A low density corresponds to a set of patterns having a low hollow volume on the given surface. A high density corresponds to a set of patterns having a large hollow volume on a surface of the same dimension. For example, as illustrated by FIGS. 4C, 5C and 6D:

compact patterns having a high density, and are therefore spaced apart by a smaller distance $L_b$, spaced apart patterns have a low density, and are therefore spaced apart by a greater distance $L_a$.

It is noted that the density, in this case, means an average density over a given surface. Variations between the distances $L_a$ and/or $L_b$ can be observed one same set of patterns. $L_a$ does not vary by more than 20% between the patterns 114a for the first set. $L_b$ does not vary by more than 20% between the patterns 114b for the second set.

During the transfer of the raised parts of the mould 1 in the layer to be printed to form the patterns, in order to obtain a more homogenous residual resin thickness between the sets of patterns of different densities, the height between the sets of patterns can be varied.

According to an example, the implantation of the first 111 and second 112 portions and the etching are configured, such that:

the first set of patterns 114a has a first pattern density $D_1$ and a first height $H_1$, the second set of patterns 114b has a second pattern density $D_2$, and a second height $H_2$, with $D_2>D_1$ and/or $H_2>H_1$.

$H_1$ and $H_2$ each mean an average pattern height for the corresponding set. $H_1$ does not vary by more than 20% between the patterns 114a for the first set. $H_2$ does not vary by more than 20% between the patterns 114b for the second set.

For this, the first set of patterns 114a can be etched in the first portion(s) 111, and the second set of patterns 114b can be etched in the second portion(s) 112. The difference of etching speed described above, thus makes it possible to adapt the height of the patterns according to the density of the sets of patterns and thus to further improve the homogeneity of the residual resin layer during nanoprinting with the mould 1.

As an example, in the case where the patterns 114a, 114b are line arrays, the residual resin thickness $H_{residual}$ after printing by the mould, for example, the master mould or a secondary mould made from a master mould, can be expressed thus:

$$H_{residual} = H_{initial} - H_{mould(n)}/(1 + L/S)$$

With:
L the width of the lines on the mould,
S the width of the spaces on the mould,
Hmould (n) the depth of the patterns n of the mould,
Hinitial the initial resin thickness.

For two different pattern densities $D_1$, $D_2$, the L/S ratio is different. In order to obtain the same residual resin thickness $H_{residual}$ after printing by the mould, the mould must have two different pattern heights $H_{mould(1)}$, $H_{mould(2)}$. The method is therefore implemented such that $E_1$ corresponds to $H_{mould(1)}$, and $E_2$ corresponds to $H_{mould(2)}$.

Each pattern 114a, 114b further has a pattern volume corresponding to the volume of the hollow zone defined by the patterns 111a, 114b in question in the layer 11. Each set of patterns 114a, 114b has a total volume Va, Vb respectively, corresponding to the sum of the hollow pattern volumes of the patterns 114a, 114b constituting it. The total volume Va, Vb depends on the height H1, H2 and on the density D1, D2 of the patterns 114a, 114b. Increasing the height H1, H2 or the density D1, D2 of the patterns 114a, 114b has the consequence of increasing the volume Va, Vb of the sets of patterns 114a, 114b.

During the nanoprinting step, the resin volume being able to be collected by a set of patterns 114a, 114b is equal to the total volume Va, Vb of the latter. Thus, such that the thickness of the residual layer is homogenous, it is necessary that the Va/Vb ratio between the total volumes Va, Vb is correctly defined, and in particular, that it is carefully chosen, if Va>Vb or if Va<Vb. The implantation of the first 111 and second 112 portions and the etching are configured such that the values of these total volumes Va, Vb are such that the resin is satisfactorily distributed between the different sets of patterns 114a, 114b. Naturally, the sizing of Va and of Vb must consider if the manufactured mould is intended to be used for manufacturing a secondary mould, or if it is intended to directly print a resin.

Following the etching, the method can comprise the removal of the etching mask 13 to obtain the mould 1. The method can comprise, before the removal of the etching mask 13, a preliminary thermal treatment step for the compatibility of the materials with the removal step.

It is therefore understood that the mould 1 comprises, in the layer 11 carrying the patterns 114a, 114b intended to be printed in a layer to be structured on a distinct substrate, at least one first non-implanted portion 111 or having a first implantation, and at least one second portion 112 having a second implantation different from the first implantation. The first 111 and second 112 portions each extending from said upper face 110. The layer further comprises a third non-implanted portion 113 extending at least from the first portion 111, and preferably from the first 111 and second 112 portions, to the lower face 115 of the layer 10. The features relative to the mould manufacturing method are described. These features can absolutely be transposed to the mould 1.

Preferably, the mould 1 is a master mould intended to perform a nanoprinting of patterns by indirect replication. However, it can be provided that the mould 1 is used for nanoprinting by direct replication.

Figure 7A:
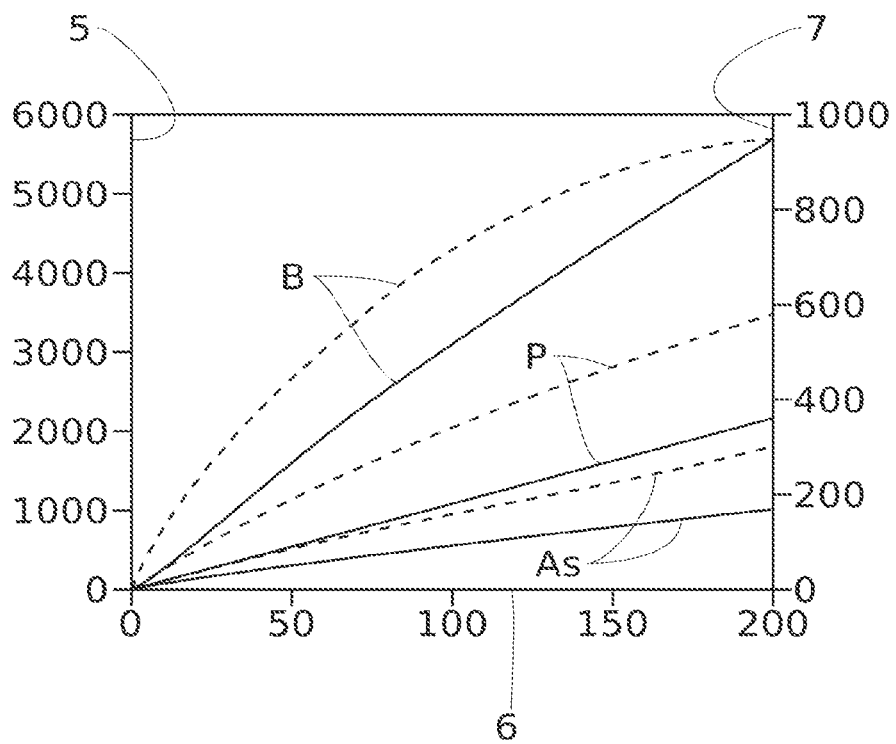
FIGS. 7A and 7B represent ion implantation diagrams respectively in silica $SiO_2$ and in a photoresin.
Figure 7B:
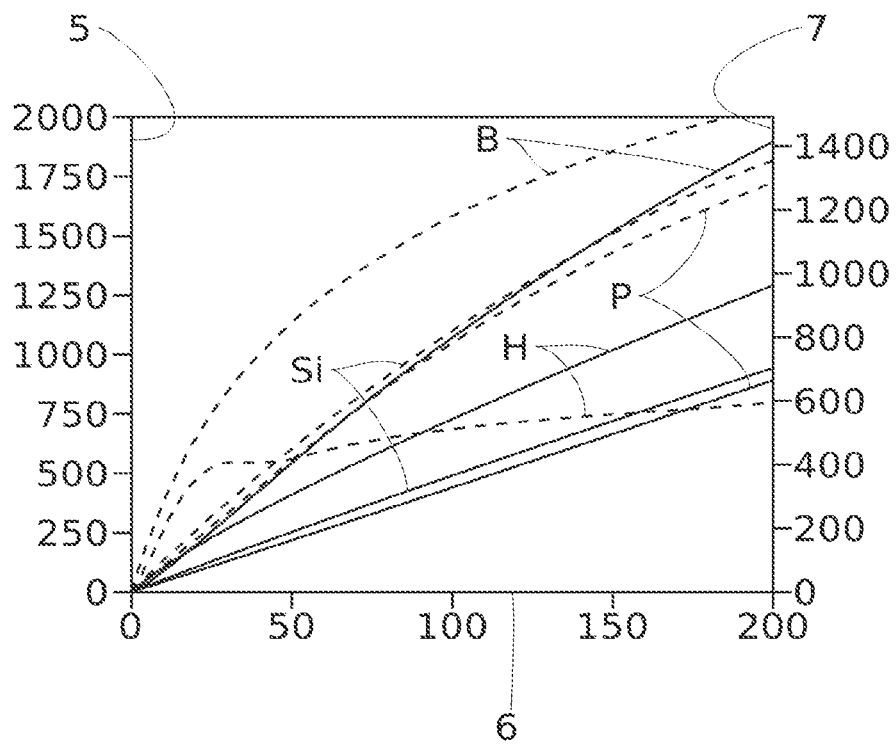

The ion implantation can be configured to implant at least one from among oxygen, hydrogen, helium, arsenic, phosphor, zinc and carbon ions, in the layer 11. The ion implantation of these ions, as well as the parameters for this, is known by a person skilled in the art. For example, reference can be made to FIGS. 7A and 7B, representing ion implantation diagrams respectively in silica $SiO_2$ and in a photoresin, available in literature for numerous ions and different materials. These diagrams represent, in a solid line, the distance travelled 5 (in angstrom Å $10^{-10}$ m) in the matter by the ions, according to the implantation energy 6 (in keV, that is $10^3$ eV), with, in a dotted line, the distribution range of the distance travelled by the ions during the implantation 7 (commonly referenced by the symbol σ), according to the implantation energy 6 (in keV, that is $10^3$ eV). In FIG. 7A, the illustrated ions are boron B, phosphor P and arsenic As ions. In FIG. 7B, the illustrated ions are boron B, silicon Si, hydrogen H and phosphor P ions. A person skilled in the art, upon reading such diagrams, will know which parameters, and in particular, which implantation energy to use to adapt the depths $P_1$ and $P_2$.

According to an example, the layer 11 is with the basis of or made of silicon and/or a material transparent at a 365 nm wavelength. According to an example, the layer is made of silicon. Concerning materials transparent at a 365 nm wavelength, according to an example, the layer is with the basis of or made of silicon oxide of formula $SiO_2$, silicon carbide of formula SiC, preferably the layer thus has a thickness less than or equal to 100 μm. According to another example, the layer is with the basis of or made of silicon nitride of formula $Si_3N_4$, preferably the layer thus has a thickness less than or equal to 10 nm.

The implantation mask 12 can be with the basis of or made of a lithography resin. The implantation mask can comprise a sublayer at the interface between the resin and the upper face 110, called partial transmission mask with the basis of or made of titanium nitride of formula TiN or silicon nitride of formula $Si_3N_4$. The etching mask 13 can be with the basis of or made of the same materials as the implantation mask 12.

Particular Examples of Embodiments of the Method

Particular examples of embodiments of the method are now described.

Figure 2A:
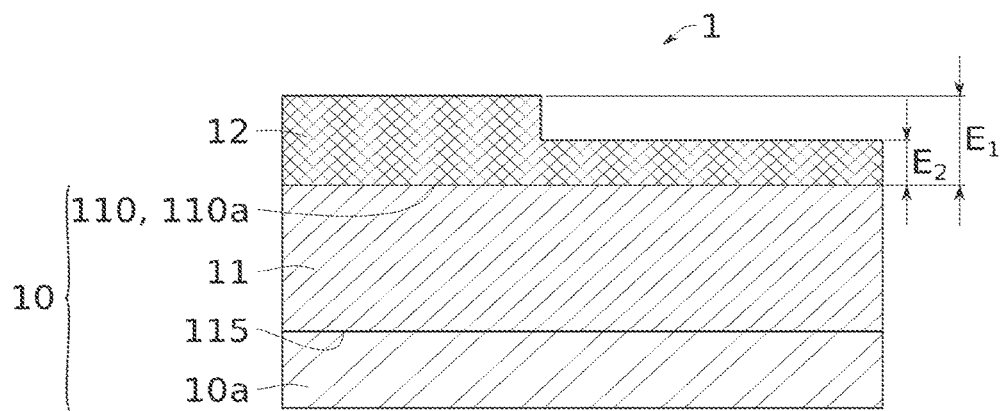
FIGS. 2A and 2B represent a cross-sectional view of the substrate comprising an implantation mask having a first thickness $E_1$ and a second thickness $E_2$ according to two examples of embodiments of the method.
Figure 2B:
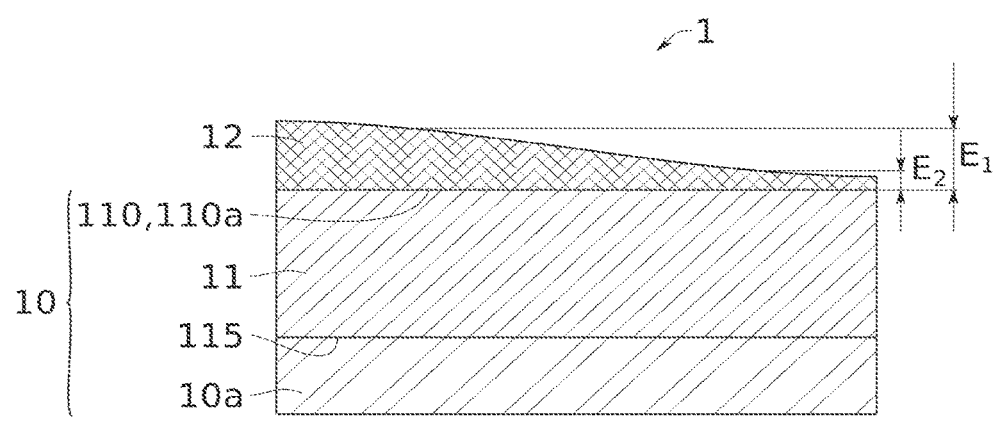

According to an example illustrated by FIGS. 2A to 5C, the method can comprise the production of an implantation mask 12 on at least one portion 110a of the upper face 10 of the layer 11. As illustrated, for example by FIGS. 2A and 2B, the production of the implantation mask 12 can be configured, such that the implantation mask 12 has a thickness gradient between at least one first thickness $E_1$ and one second thickness $E_2$, with $E_1$ strictly greater than $E_2$ and $E_2$ zero or strictly greater than 0. The implantation mask 12 thus creates a thickness differential above the layer 11. In FIGS. 2A and 2B, the example is illustrated in a non-limiting manner, according to which the thickness $E_2$ is non-zero.

The ion implantation can be performed through the implantation mask 12. Thanks to the thickness differential of the implantation mask 12, the first implanted portion 111 can have a first implantation depth $P_1$ and the second implanted portion 112 can have a second implantation depth $P_2$, with $P_2$ strictly greater than $P_1$ and $P_1$ zero or greater than 0. The path of the ions is considered in a favoured direction perpendicular to the main extension plane of the upper face 110 of the layer 11.

Figure 3A:
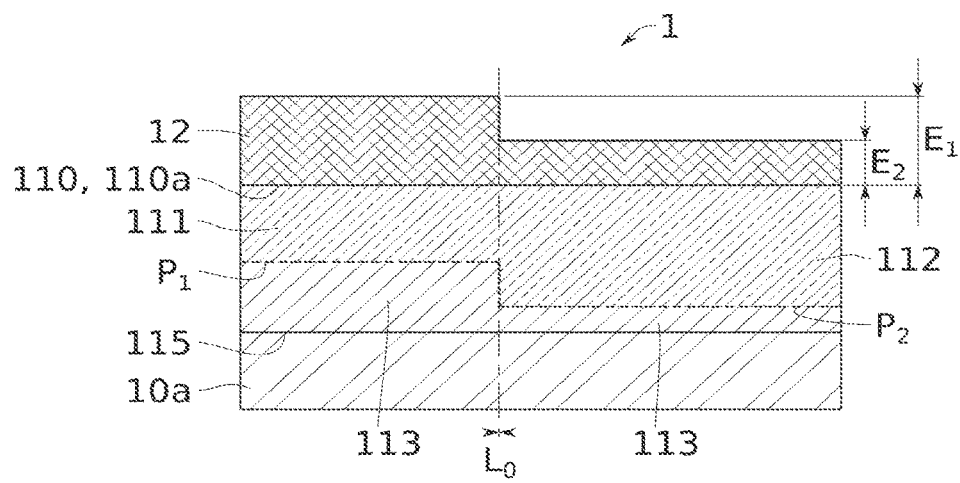
FIGS. 3A and 3B represent a cross-sectional view of the substrate respectively illustrated by FIGS. 2A and 2B, after an ion implantation according to an example of an embodiment of the method.
Figure 3B:
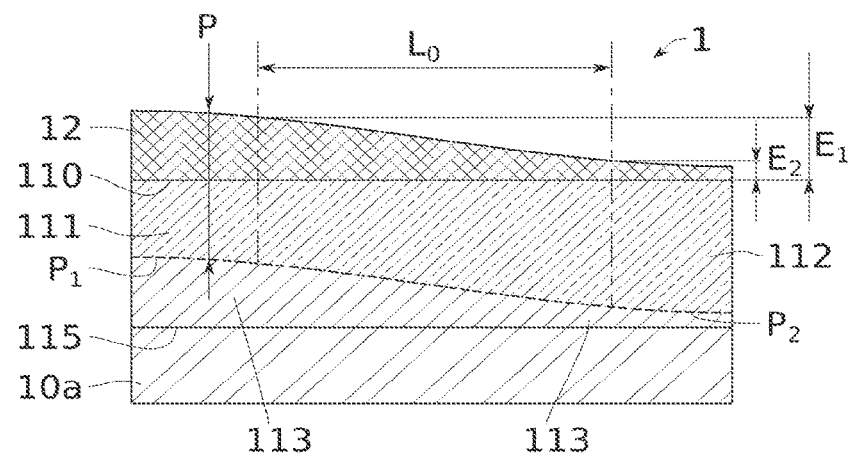

According to the example illustrated by FIGS. 3A and 3B, $P_2 > P_1 > 0$. Thus, the first portion 111 is implanted up to the first depth $P_1$, and the second portion 112 is implanted up to the second depth $P_2$. The third portion 113 can extend from the first depth $P_1$, and preferably from the first and second depths $P_1$, $P_2$, up to the lower face 150 of the layer 11. According to an example, the entire upper face 110 of the layer 11 is implanted, at different depths.

For this, the ion implantation can be configured to implant the layer 11 through the implantation mask 12 such that the implanted ions pass through the implantation mask 12 and penetrate into the layer 11, over a distance greater than $E_1$ and $E_2$ taken perpendicularly to the upper face 110 of the layer 11.

The ion implantation can, for this, be configured such that at least one, and preferably each, from among the first $P_1$ and second $P_2$ implantation depths is greater than 30 nm, and preferably less than 1 µm. The distance travelled by the ions following their penetration into the implantation mask 12 can be greater than 30 nm, and preferably less than 1 µm. The ion implantation can more specifically be performed by an implanter device, in a known manner by a person skilled in the art.

Figure 3C:
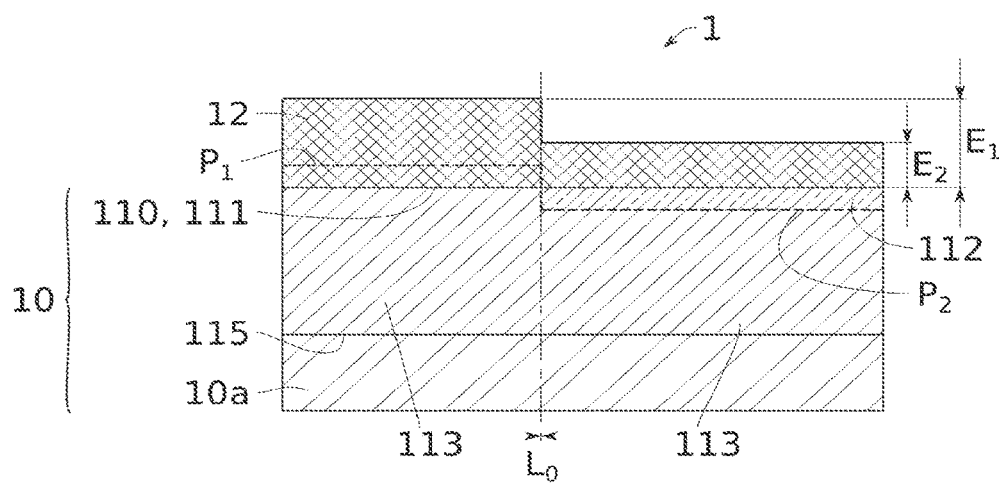
FIG. 3C represents a cross-sectional view of the substrate illustrated by FIG. 2B, after an ion implantation according to an example of an embodiment of the method other than that illustrated by FIGS. 3A and 3B.

According to the example illustrated by FIG. 3C, $P_2 > P_1$ and $P_1 = 0$ with respect to the upper face 110 of the layer 11. Thus, the first portion 111 has a zero implantation depth $P_1$ at the layer 11. The first portion 111 is therefore not implanted in the layer 11 and can be combined with the third non-implanted portion 113. The second portion 112 is implanted up to the second non-zero depth $P_2$ in the layer 11. The third portion 113 can extend from the second depth $P_2$, to the lower face 150 of the layer 11. Thus, a fraction of the upper face 110 is not implanted.

For this, the ion implantation can be configured to implant the layer 11 through the implantation mask 12, such that the implanted ions pass through the implantation mask 12 over a distance less than $E_1$ and do not penetrate into the layer 11 at the first portion 111. According to this example, the implanted ions pass through the implantation mask 12 over a distance greater than $E_2$ and penetrate into the layer 11 at the second portion 112.

The ion implantation can, for this, be configured so as the first $P_1$ and second $P_2$ implantation depths are less than 30 nm, preferably less than 10 nm. The distance travelled by the ions following their penetration into the implantation mask 12 can be less than 30 nm, and preferably less than 10 nm. The ion implantation can more specifically be performed by a plasma, and in particular by immersion of the substrate 10 in a plasma, in a known manner by a person skilled in the art.

According to an example, the first thickness $E_1$ is substantially between 50 nm and 100 µm. According to an example, the second thickness $E_2$ is substantially between 0 nm and $E_1$. These dimensions are, in particular, chosen according to the design of the mould and to the targeted application. According to an example, the thickness gradient of the mask is substantially equal to the depth difference between $P_1$ and $P_2$.

The implantation mask 12, to have this thickness gradient, can, for example, be performed by greyscale lithography, or alternative methods, like near-field lithography, for example by NanoFrazor™ equipment, and the associated method. Choosing the suitable technology will depend on the tolerances over the distance $L_0$ which separates the sets of patterns of different heights, in a direction parallel to the main extension plane of the upper face 110.

According to an example, the implantation mask 12 is configured, such that the first 111 and second 112 portions are spaced apart, in a direction parallel to the main extension plane of the upper face 110, by a distance $L_0$ less than the smallest distance $L_1$ separating two adjacent patterns 114a, 114b of different heights, and more specifically, separating a first set of patterns 114a and a second set of patterns 114b, as illustrated in FIGS. 3A to 3C, compared with FIGS. 4C and 5C.

As illustrated by FIG. 3B, the implantation mask 12 can have a progressive thickness gradient between $E_1$ and $E_2$, over the length $L_0$. It is noted that $E_2$ can be zero, the implantation mask 12 only covering a fraction 110a of the upper face 110, or be strictly greater than 0. Following the ion implantation, the first 111 and second 112 portions can thus be separated by an intermediate portion 116, in a direction parallel to the main extension plane of the upper face 110. In this intermediate portion 116, the implantation depth can vary between $P_1$ and $P_2$ to form a progressive depth gradient. It is noted that it can be provided that $P_1$ is zero, or strictly greater than 0 as illustrated, according to the examples described above. Preferably, $L_0$ is substantially less than or equal to the smallest distance separating the first and second portions. As illustrated by FIGS. 3A and 3C, the implantation mask 12 can have a sharp thickness gradient between $E_1$ and $E_2$, over a length $L_0$ for example, substantially less than or equal to the smallest distance separating the first and second portions. It is noted that, in this case also, $E_2$ can be zero or be strictly greater than 0. Following the ion implantation, the first 111 and second 112 portions can thus be directly adjacent in a direction parallel to the main extension plane of the upper face 110.

According to an example, the method comprises a removal of the implantation mask 12 after implantation and before the etching step, preferably before the production of the etching mask 13.

According to an example, the etching mask 13 is produced after the ion implantation, as illustrated, for example, by passing from FIGS. 3A and 3C to FIGS. 4A and 5A. During the etching, the implanted portions of the layer 11 preferably have a greater etching speed than the non-implanted portions.

Figure 4A:
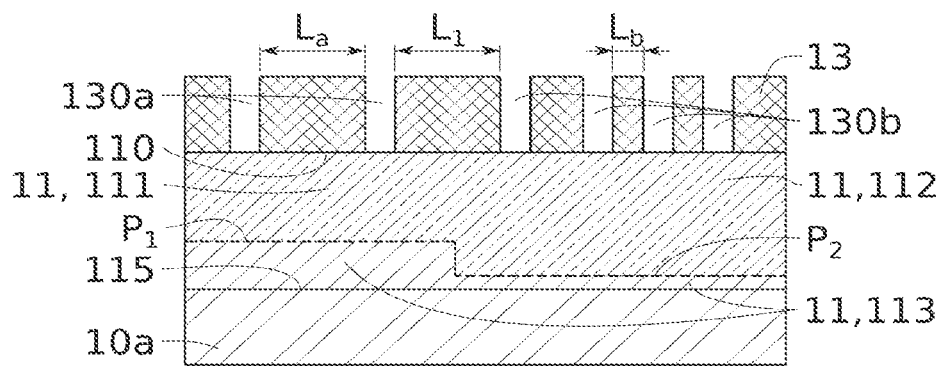
FIGS. 4A to 4C represent a cross-sectional view of the substrate illustrated by FIG. 3A, during pattern etching steps according to an example of an embodiment of the method.
Figure 4B:
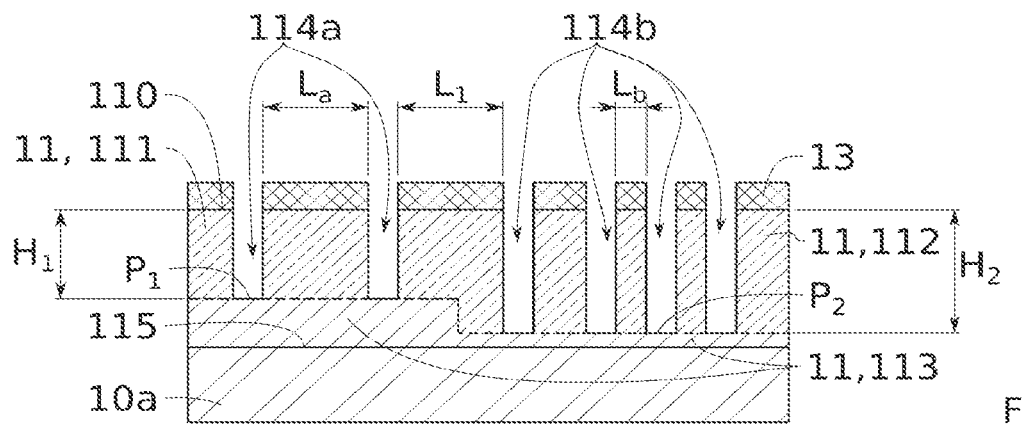
Figure 5A:
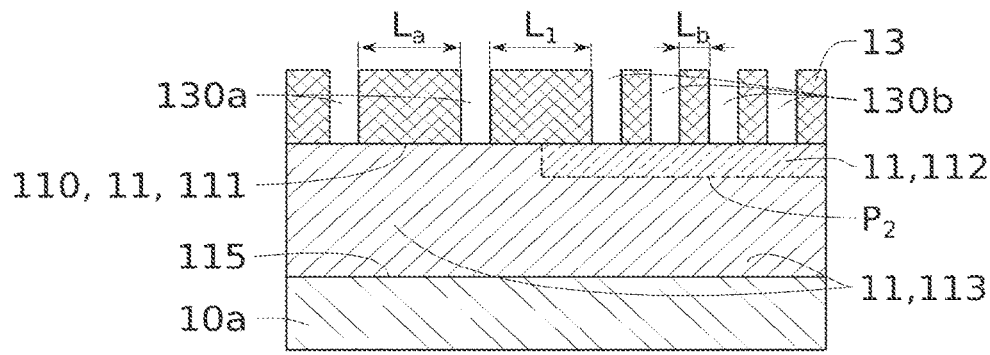
FIGS. 5A to 5C represent a cross-sectional view of the substrate illustrated by FIG. 3C, during pattern etching steps according to an example of an embodiment of the method.
Figure 5B:
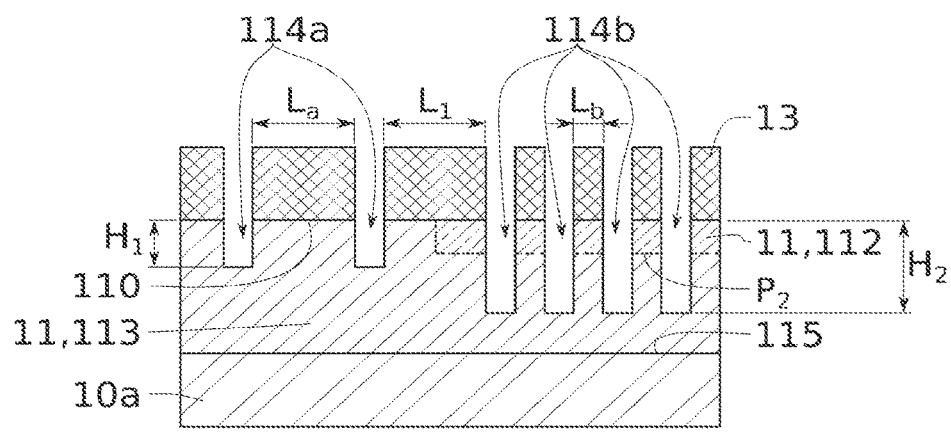
Figure 5C:
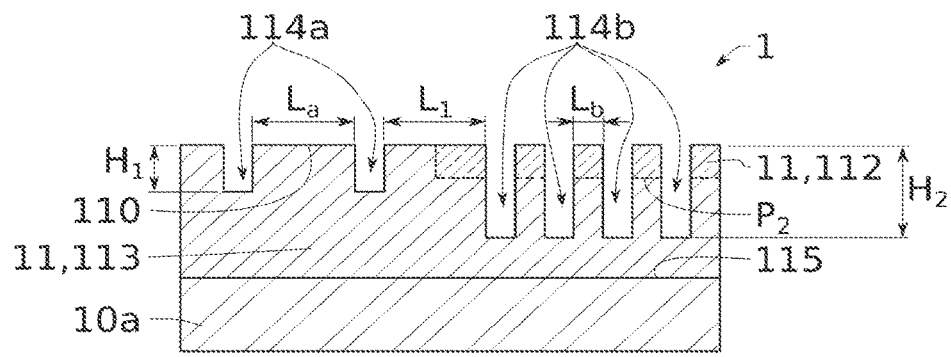

As illustrated, for example, by FIGS. 4A and 5A, the etching mask 13 can have openings 130a and 130b delimiting the openings corresponding to the patterns 114a and 114b to be etched in the layer 11. A distance $L_1$ can separate the set of patterns 114a and the set of patterns 114b, of different pattern densities, for example symbolised by the lengths $L_a$ and $L_b$. The difference of etching speed between the implanted portions and the non-implanted portions leads to the etching of patterns 114a, 114b of different heights, as illustrated by FIGS. 4B and 5B. Following the etching, the method can comprise the removal of the etching mask 13, to obtain the mould 1 illustrated by FIGS. 4C and 5C.

An example of etching is now described in reference to FIGS. 4A to 4C. The etching can be performed over an etching duration, chosen such that the entire thickness of the second portion 112 is consumed in line with the openings 130b of the etching mask 13, preferably without consuming the third portion 113. The first portion 111 having a depth $P_1$ less than the depth $P_2$ of the second portion 112, and the third portion 113 having a less etching speed, the height of the patterns 114a will be less than the height of the patterns 114b in the second portion 112. The depth of the patterns is thus controlled with accuracy with the etching time.

According to an example, the etching is configured to selectively etch each implanted portion with respect to the third non-implanted portion 113. The etching can be configured, such that the entire thickness of the first 111 and second 112 portions is consumed in line with the openings 130b of the etching mask 13. Thus, the non-implanted portion 113 forms a stop layer of the etching. Only the first 111 and second 112 portions are etched significantly, which enables a controlled stopping of the etching. Controlling the depth of the patterns 114a, 114b is thus also improved.

An example of etching is now described in reference to FIGS. 5A to 5C. The second portion 112 can have an etching speed greater than that of the third portion 113. The etching can be performed over an etching duration, chosen such that the entire thickness of the second portion 112 is consumed in line with the openings 130b of the etching mask 13, as well as a part of the third portion 113. The second portion 112 being consumed more rapidly, a height differential can be obtained between the patterns 114a of height $H_1$ and the patterns 114b of height $H_2$ for one same etching time, as illustrated by FIG. 5B. It is noted that it can be provided that the second portion 112 has an etching speed less than that of the third portion 113, the height differential thus being reversed.

Another example of an embodiment of the method is now described in reference to FIGS. 6A to 6D. The method can comprise several ion implantations, so as to implant a plurality of first portions 111 and a plurality of second portions 112. Each implanted portion can be separated from the adjacent implanted portion by a third non-implanted portion 113. The ion implantations are thus performed in a localised manner in the layer 11.

For this, the method can comprise the production of the etching mask 13, the etching mask having the openings 130a, 130b corresponding to the patterns 114a, 114b to be etched. The ion implantation can be performed through the etching mask 13 and be configured, such that the implanted portions 111, 112 extend into the layer 11 in line with the openings 130a, 130b. Each of the first and second implanted portions 111, 112 can extend, in a direction parallel to the main extension direction of the upper face 110, over a distance $L_3$, $L_4$ substantially equal to a dimension $L_3$, $L_4$ of the corresponding pattern 114a, 114b produced during the etching, in the same direction. The lengths $L_3$, $L_4$ are preferably substantially equal to the distance between the walls delimiting the openings 130a, 130b, in this direction.

Figure 6A:
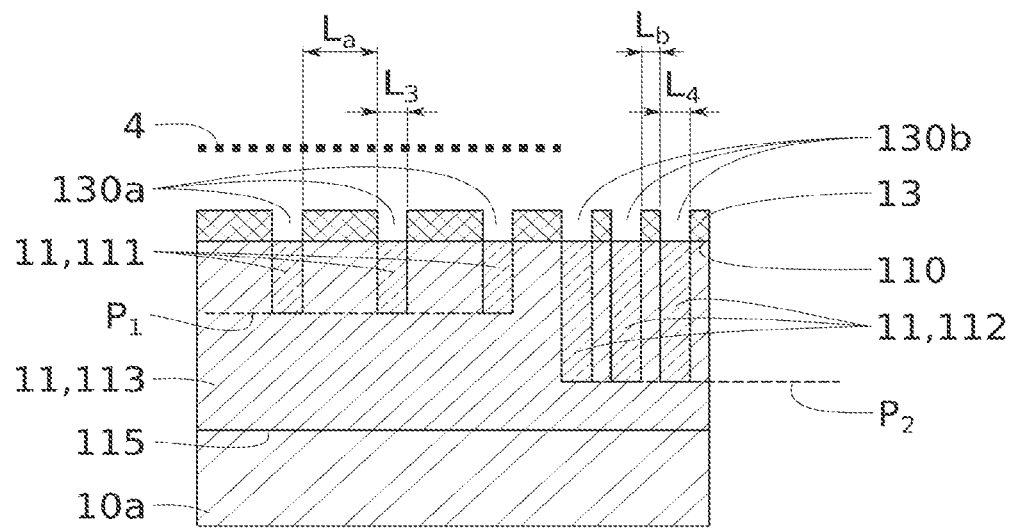
FIGS. 6A and 6B represent a cross-sectional view of the substrate after a localised ion implantation, according to two other examples of embodiment of the method.
Figure 6B:
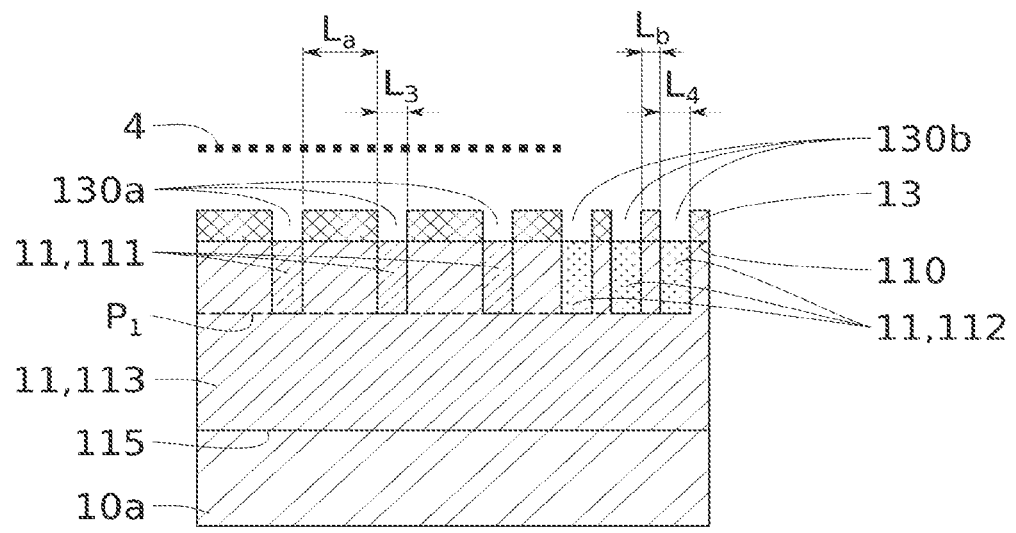

The ion implantations can be configured together, such that the first portions 111 differ from the second portions 112 by:
  their implantation depths $P_1$, $P_2$, as for example illustrated by FIG. 6A, and/or
  a nature of the implanted ions, and/or a dose of implanted ions, as for example illustrated by FIG. 6B.

The first portions 111 can correspond to the first set of patterns 114a described above. The second portions 112 can correspond to the second set of patterns 114b described above.

The ion implantations can be performed by an implanter. The implanter can comprise movable blades 4, so as to mask a part of the etching mask 13. During a first ion implantation, the blade 4 can mask the openings 130b so as to only implant the first portions 111. During a second ion implantation, the blade 4 can mask the openings 130a so as to only implant the second portions 112. Thus, the portions 111, 112 can be successively implanted without requiring multiple steps of depositing an etching mask 13 and 15 implantations for each type of implanted portions.

As illustrated by FIG. 6A, the first portions 111 can differ from the second portions 112 by their implantation depth, with P1<P2. The etching can be performed over an etching duration, such that the entire thickness of the second portions 112 is consumed in line with the openings 130b of the etching mask 13, preferably without consuming the third portion 113. The first portions 111 having a depth P1 less than the depth P2 of the second portion 112, the height of the patterns 114a will be less than the height of the patterns 114b in the second portions 112. The depth of the patterns is thus controlled with accuracy with the etching time.

According to a preferred example, the etching is configured to selectively etch each implanted portion 111, 112 with respect to the third non-implanted portion 113. The etching can be configured, such that the entire thickness of the first 111 and second 112 portion 11 is consumed in line with the openings 130b of the etching mask 13. Thus, the non-implanted portion 113 forms a stop layer of the etching. Only the first 111 and second 112 portions are etched significantly, which enables a controlled stopping of the etching. This can, as an example, be illustrated in passing from FIG. 6A to FIG. 6C. Controlling the depth of the patterns 114a, 114b is thus further improved.

As illustrated by FIG. 6B, the first portions 111 can differ from the second portions 112 by the nature of the implanted ions and/or the implanted dose, for one same depth P1 as illustrated or of different implantation depths. The etching can be performed over an etching duration chosen such that the entire thickness of the second portions 112 is consumed in line with the openings 130b of the etching mask 13, and consume at least one part of the third portion 113. The first portions 111 can have an etching speed less than that of the second portions 112. With the second portions 112 being consumed more rapidly, a height differential can be obtained between the patterns 114a of height $H_1$ and the patterns 114b of height $H_2$ for one same etching time, as illustrated by passing from FIG. 6B to FIG. 6C. It is noted that it can be provided that the second portions 112 have an etching speed less than that of the first portions 111, the height differential thus being reversed.

Figure 6C:
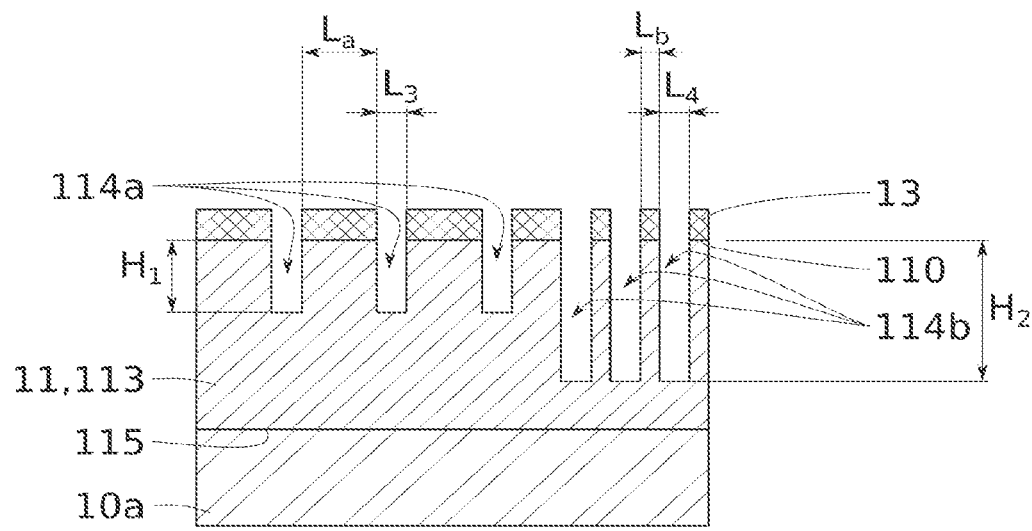
FIGS. 6C and 6D represent a cross-sectional view of the substrate illustrated by any one of FIGS. 6A and 6B, during pattern etching steps according to an example of an embodiment of the method.
Figure 6D:
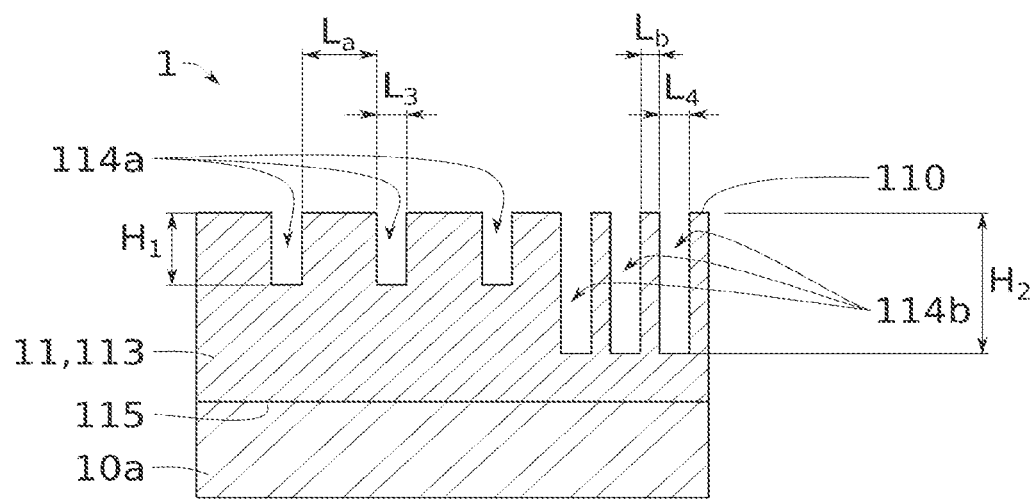

As indicated above and illustrated by passing from FIG. 6C to FIG. 6D, the etching mask 13 can be removed after the production of the patterns 114a and 114b.

Figure 6E:
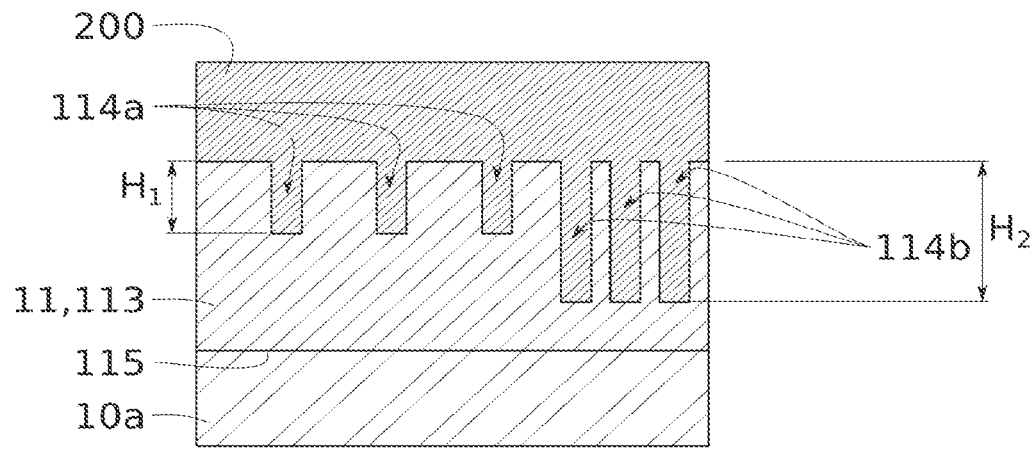
FIGS. 6E to 6G represent a cross-sectional view of an embodiment, wherein the mould is a master mould enabling the production of a secondary mould and the pressing of the latter to produce a final pattern.
Figure 6F:
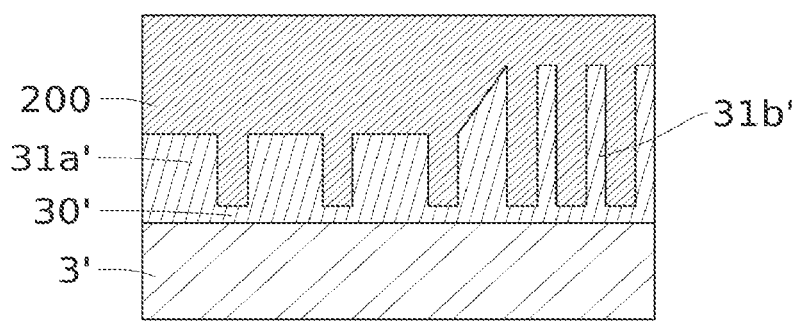
Figure 6G:
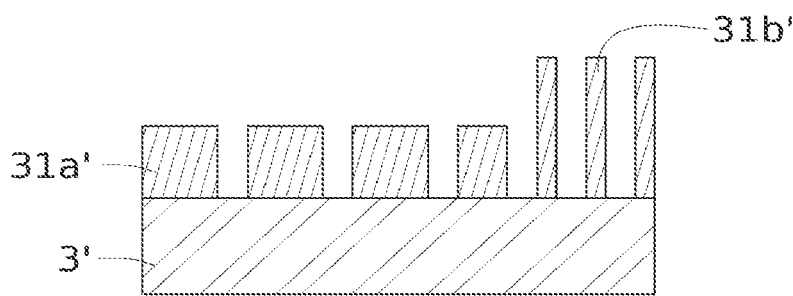

FIG. 6D quite specifically illustrates a mould 1 intended to serve as a master mould in a nanoprinting method. As illustrated in FIG. 6E, it can indeed serve to make a secondary mould 200 having reversed patterns, which themselves will be printed in the resin to be structured. In FIG. 6E, the master mould 1 is represented under the secondary mould 200 for clarity and homogeneity with the preceding figures. Naturally, in the scope of producing a secondary mould 200, during the pressing step, the master mould 1 can be placed above a deformable layer, intended to form the secondary mould 200 and pressed in the latter. In this application, the dimensions of the openings 130a in the etching mask and the implantation parameters, in particular, will be chosen such that the total volume Vb of the hollow zones defined by the second set of patterns 114b is greater than the total volume Va of the hollow zones defined by the first set of patterns 114a. Va being the surface occupied by the cavities of the patterns 114a of the first set, surface taken in a horizontal plane in FIGS. 6A to 6E, and Vb being the surface occupied by the cavities of the patterns 114b of the second set, surface taken in a horizontal plane in FIGS. 6A to 6E. Preferably, the density of the second set of patterns 114b is such that D2>D1, with, as a condition on the height of the patterns, preferably H2>H1 or H2<H1 such that Vb>Va. It can also be provided that D2<D1 and H2>H1 as long as Vb>Va. The dimensions D1, D2, H1 and H2 being taken on the master mould 1. In this way, as represented in FIG. 6F, during the nanoprinting of the secondary mould 200 in a resin layer, the resin is distributed such that the residual layer 30' has a homogenous thickness. This makes it possible to preserve the critical dimensions of the patterns 31a', 31b' during their etching in the substrate 3', or at least limit their degradation (FIG. 6G).

Figure 8A:
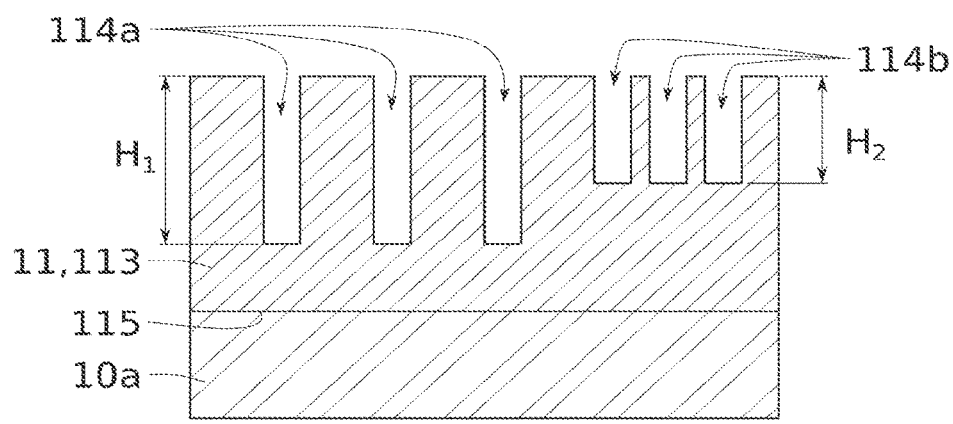
FIGS. 8A to 8C represent a cross-sectional view of an embodiment, wherein the mould is a direct mould and the pressing of the latter to produce a final pattern.
Figure 8B:
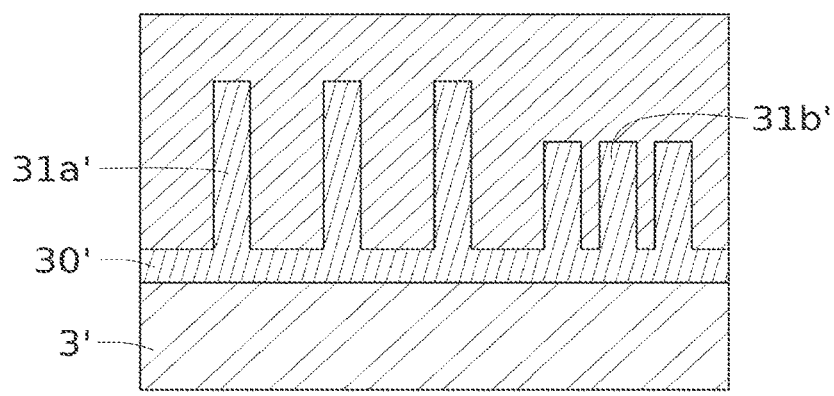
Figure 8C:
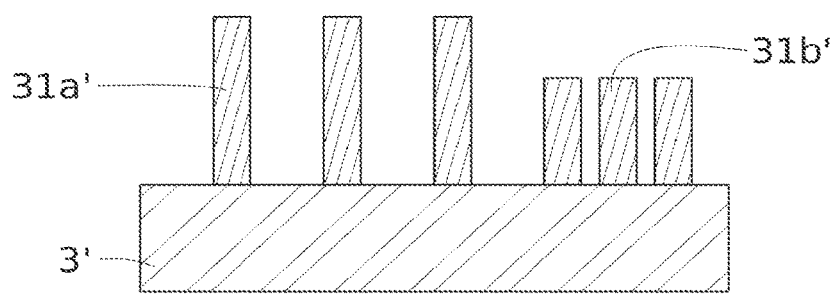

The manufacturing method can also be implemented with the aim of manufacturing a so-called direct mould, i.e. intended for a direct replication of the patterns, without passing through a master mould, then a secondary mould. In this scenario, the dimensions of the openings 130a in the etching mask and the implantation parameters, in particular, will this time be chosen, such that the total volume Vb of the hollow zones defined by the second set of patterns 114b is less than the total volume of the hollow zones Va defined by the first set of patterns 114a. For this, D2<D1 can be had, with as a condition on the height of the patterns, H2<H1. D2<D1 and H2>H1 as long as Vb>Va can also be had. It can also be provided that D2>D1 and H2<H1 as long as Vb<Va. The dimensions D1, D2, H1 and H2 being taken on the "direct" single mould, as illustrated in FIG. 8A. In this way, there again, a better distribution of the resin and therefore a residual layer 30' of homogenous thickness is obtained during nanoprinting (FIG. 8B). As above, the critical dimensions of the patterns 31a', 31b' are preserved or, at least, less degraded than during methods of the prior art (FIG. 8C).

Example of a particular implementation of the method by a user

Below, an example of an implementation of the method by a user, in a non-limiting manner, is described.
  the user chooses the material to be implanted,
  according to the material chosen, the user selects the ions to be implanted, which:
    modify the material to be implanted chosen beforehand, and
    make it possible to identify an etching chemistry (dry or wet) to selectively etch the implanted portion(s) of the non-implanted material. Experimental tests on solid plates (plates without or with pattern) can be implemented to identify the optimal etching method(s),
  the implantation conditions are thus determined by simulation according to the desired geometries (for example, depths of the patterns),
  knowing the ions and the implantation conditions, materials can thus be identified which will serve as a mask and protection for the implantations, in particular materials with a sufficient stopping power,
  the deposition of the mask and the ion implantation are then performed,
  the mask can be removed or preserved for a subsequent removal,
  the selective etching is implemented to form the patterns,
  if the dimensions of the patterns differ from the targeted dimensions, then a correction on the patterns can be made to adjust these dimensions, for example, by optical proximity correction (OPC).

In view of the description above, it clearly appears that the invention proposes a manufacturing method, making it possible to improve the manufacture of a mould for nanoprinting the residual resin thickness, as well as a mould improving the control of the residual resin thickness.

The invention is not limited to the embodiments described above and extends to all the embodiments covered by the invention. The present invention is not limited to the examples described above. Plenty of other variants of embodiments are possible, for example, by combining features described above, without moving away from the scope of the invention. Furthermore, the features described relating to an aspect of the invention can be combined with another aspect of the invention. The mould can have any feature resulting from the implementation of a feature of the method and conversely, the method can comprise any step making it possible to obtain a feature of the mould.

The invention claimed is:

1. A method for manufacturing a mould for nanoprinting, comprising:
  providing a substrate comprising a layer having an upper face and a lower face opposite the upper face,
  at least one ion implantation in at least one portion of the layer, the at least one ion implantation being configured so as to obtain within the layer at least one first portion, non-implanted or having a first implantation, and at least one second portion having a second implantation, the first implantation and the second implantation being different, the first and second portions each extending from the upper face, the at least one ion implantation further defining a third non-implanted portion, extending at least from the first portion, to the lower face of the layer,
  after or before implantation, producing an etching mask, surmounting the upper face and having a plurality of openings, and
  after implantation, etching the layer configured so as to have a different etching speed at least between the second portion and the third portion, so as to etch through the openings of the etching mask, a plurality of patterns of different heights included in the layer, at least one pattern extending into the first portion and at least one pattern extending into the second portion, the etching being configured to etch in the first portion, a first set of patterns and to etch in the second portion, a second set of patterns:
    i. the first set of patterns having a first pattern density D1 and a first height H1, and
    ii. the second set of patterns having a second pattern density D2, and a second height H2, and wherein D2>D1.

2. The method according to claim 1, wherein the first implantation and the second implantation differ by at least one parameter from among: an implantation depth, a nature of the implanted ions, a dose of implanted ions.

3. The method according to claim 1, wherein the etching is configured such that the etching speed at least of the second portion, is greater than the etching speed of the third non-implanted portion.

4. The method according to claim 1, wherein, prior to the at least one ion implantation, the method comprises producing an implantation mask on at least one portion of the upper face of the layer, and the at least one ion implantation is at least partially performed through the implantation mask, such that the first implanted portion has a first implantation depth $P_1$ and the second implanted portion has a second implantation depth $P_2$, with $P_2$ strictly greater than $P_1$ and $P_1$ equal to zero or greater than 0.

5. The method according to the preceding claim 4, wherein the implantation mask is configured so as to have a thickness gradient between at least one first thickness $E_1$ and one second thickness $E_2$, with $E_1$ strictly greater than $E_2$ and $E_2$ equal to zero or greater than 0.

6. The method according to claim 4, wherein the at least one ion implantation is configured, such that at least the second implantation depth $P_2$ is greater than 30 nm.

7. The method according to claim 4, wherein the at least one ion implantation is configured, such that the first and second implantation depths are less than or equal to 30 nm.

8. The method according to claim 4, wherein the implantation mask is configured such that the first and second portions are spaced apart, in a direction parallel to a main extension plane of the upper face of the layer, by a distance less than a smallest distance separating two adjacent patterns of different heights.

9. The method according to claim 4, wherein the implantation mask is configured, such that the first and second portions are separated by an intermediate portion, wherein the implantation depth varies.

10. The method according to claim 4, wherein the implantation mask is configured, such that the first and second portions are directly adjacent.

11. The method according to claim 1, wherein, prior to the etching, the method comprises several ion implantations, so as to implant a plurality of first portions and a plurality of second portions, the ion implantations being configured together, such that:

the first portions differ from the second portions by at least one parameter taken from among: a nature of the implanted ions, a dose of implanted ions, and/or the first and second portions have different implantation depths $P_1$, $P_2$ between the first portions and the second portions.

12. The method according to claim 11, wherein the ion implantations are performed through the etching mask, such that each of the first and second implanted portions extends in line with the openings of the etching mask.

13. The method according to claim 1, wherein the etching is configured to selectively etch each implanted portion with respect to the third non-implanted portion.

14. The method according to claim 1, wherein the etching is stopped after having consumed an entire thickness of the second portion located in line with the openings of the etching mask.

15. The method according to claim 1, wherein the at least one ion implantation is configured to implant at least one from among oxygen, hydrogen, helium, arsenic, phosphor and carbon ions, in the layer.

16. The method according to claim 1 wherein the layer is based upon at least one from among silicon or a transparent material with a 365 nm wavelength.

17. The method according to claim 1 wherein $H2 > H1$.

18. The method according to claim 1, wherein $H2 < H1$.

* * * * *